US011215186B2

(12) United States Patent
Okada

(10) Patent No.: US 11,215,186 B2
(45) Date of Patent: Jan. 4, 2022

(54) VACUUM PUMP CONTROL APPARATUS AND VACUUM PUMP, AND ASSEMBLY METHOD OF VACUUM PUMP CONTROL APPARATUS

(71) Applicant: Edwards Japan Limited, Yachiyo (JP)

(72) Inventor: Takuya Okada, Yachiyo (JP)

(73) Assignee: Edwards Japan Limited, Yachiyo (JP)

( * ) Notice: Subject to any disclaimer, the term of this patent is extended or adjusted under 35 U.S.C. 154(b) by 305 days.

(21) Appl. No.: 16/345,053

(22) PCT Filed: Oct. 31, 2017

(86) PCT No.: PCT/JP2017/039456
§ 371 (c)(1),
(2) Date: Apr. 25, 2019

(87) PCT Pub. No.: WO2018/084160
PCT Pub. Date: May 11, 2018

(65) Prior Publication Data
US 2019/0277296 A1    Sep. 12, 2019

(30) Foreign Application Priority Data
Nov. 4, 2016  (JP) .............................. JP2016-216523

(51) Int. Cl.
*H05K 7/14*  (2006.01)
*F04D 19/04*  (2006.01)
*H05K 7/20*  (2006.01)

(52) U.S. Cl.
CPC .............. *F04D 19/04* (2013.01); *H05K 7/14* (2013.01); *H05K 7/20* (2013.01)

(58) Field of Classification Search
USPC ......................... 417/44.1; 361/792, 760, 679
See application file for complete search history.

(56) References Cited

U.S. PATENT DOCUMENTS 3,728,584 A * 4/1973 Kuhlow ............. H01L 23/4006
361/712
5,243,218 A     9/1993 Zenitani et al.
(Continued)

FOREIGN PATENT DOCUMENTS

CN     104755765 A    7/2015
EP     2631486 A1     8/2013
(Continued)

OTHER PUBLICATIONS

Extended Search Report from counterpart European Application No. 17867065.7, dated May 12, 2020, 7 pp.
(Continued)

*Primary Examiner* — Hung S. Bui
(74) *Attorney, Agent, or Firm* — Shumaker & Sieffert, P.A.

(57) ABSTRACT

A vacuum pump control apparatus may include a plurality of circuit boards including a first circuit board and a second circuit board which constitute a control circuit that controls a vacuum pump main body; a housing having an internal space in which the plurality of the circuit boards are arranged, in which an upper side of the housing is open; a heat radiating plate having a bottom surface portion to which the first circuit board is mounted so as to enable heat radiation and which is arranged on the housing so as to close the opening of the housing; and a board fixing means which fixes the second circuit board to a board mounting seat portion of the housing so as to enable heat radiation.

12 Claims, 7 Drawing Sheets

(56) References Cited

U.S. PATENT DOCUMENTS

| | | | | |
|---|---|---|---|---|
| 5,473,510 | A * | 12/1995 | Dozier, II | H01L 23/4006 174/548 |
| 6,249,442 | B1 * | 6/2001 | Watanabe | H05K 7/142 174/138 E |
| 6,466,447 | B2 * | 10/2002 | Murowaki | H05K 1/147 361/728 |
| 6,522,528 | B2 | 2/2003 | Yamane | |
| 6,606,254 | B2 | 8/2003 | Yoneda | |
| 7,619,899 | B2 * | 11/2009 | Rubenstein | H05K 1/141 361/740 |
| 9,353,755 | B2 * | 5/2016 | Nagano | F04D 29/5813 |
| 9,964,112 | B2 | 5/2018 | Yamato et al. | |
| 10,215,191 | B2 | 2/2019 | Omori et al. | |
| 2013/0189089 | A1 * | 7/2013 | Schroder | F04D 25/068 415/182.1 |
| 2013/0209272 | A1 | 8/2013 | Omori et al. | |
| 2015/0184665 | A1 * | 7/2015 | Yamato | F04D 29/58 415/47 |
| 2017/0227018 | A1 | 8/2017 | Moriyama | |

FOREIGN PATENT DOCUMENTS

| | | |
|---|---|---|
| EP | 2894346 A1 | 7/2015 |
| JP | H04188795 A | 7/1992 |
| JP | 2001230580 A | 8/2001 |
| JP | 2002261476 A | 9/2002 |
| JP | 2002293202 A | 10/2002 |
| JP | 2015105602 A | 6/2015 |
| JP | 5952191 B2 | 7/2016 |
| JP | 2016145555 A | 8/2016 |
| WO | 2007013274 A1 | 2/2007 |
| WO | 2012046495 A1 | 4/2012 |

OTHER PUBLICATIONS

Translation of and original International Seacrh Report and original Written Opinion dated Jan. 30, 2018 in counterpart International Application No. PCT/JP2017/039456, 9 pp.

* cited by examiner

US 11,215,186 B2

VACUUM PUMP CONTROL APPARATUS AND VACUUM PUMP, AND ASSEMBLY METHOD OF VACUUM PUMP CONTROL APPARATUS

This application is a U.S. national phase application under 37 U.S.C. § 371 of international application number PCT/JP2017/039456 filed on Oct. 31, 2017, which claims the benefit of priority to JP application number 2016-216523 filed Nov. 4, 2016. The entire contents of each of international application number PCT/JP2017/039456 and JP application number 2016-216523 are incorporated herein by reference.

TECHNICAL FIELD

The present disclosure relates to a vacuum pump control apparatus and a vacuum pump, and an assembly method of the vacuum pump control apparatus and, in particular, to a vacuum pump control apparatus and a vacuum pump capable of reducing adverse effects on a control circuit which controls a vacuum pump main body and efficiently cooling the control circuit, and an assembly method of the vacuum pump control apparatus.

BACKGROUND

Conventionally, vacuum pumps such as turbo-molecular pumps which perform an exhaust process by rotating a rotor at high speed inside a casing having an inlet port and an outlet port are known. In addition, a vacuum pump control apparatus (controller) which controls drive of a motor for rotating a rotor of a vacuum pump main body thereof and a vacuum pump constructed by electrically connecting the vacuum pump control apparatus to the vacuum pump main body are also known (for example, refer to Japanese Patent No. 5952191 and Japanese Patent No. 3165857).

Vacuum apparatuses which are configured so as to maintain an internal vacuum by performing an exhaust process using a vacuum pump in this manner include a semiconductor manufacturing apparatus, an electron microscope apparatus, a surface analysis apparatus, and a fine processing apparatus. When such a vacuum apparatus is affected by heat, an error in measurement accuracy or processing accuracy may increase and a significant failure may occur in processes performed by the vacuum apparatus.

In addition, in a vacuum apparatus using a motor, rotation of the motor during deceleration and the like generates electrical energy in reverse (regenerative energy). Furthermore, as the regenerative energy is converted into thermal energy, heat is inevitably generated on a circuit board constituting a control circuit. Therefore, the circuit board is cooled by radiating heat through a housing or the like.

FIG. 9 is a sectional view showing a schematic configuration example of a conventional vacuum pump control apparatus 200. The vacuum pump control apparatus 200 shown in FIG. 9 is constituted by: a housing 202 having an internal space 201 and an open upper surface; a heat radiating plate 203 arranged so as to close the upper side of the housing 202; a power supply 204, a power device 205, and a circuit board 206 which are mounted to an inner surface of the heat radiating plate 203 and arranged inside the space 201 of the housing 202; a front panel 208 mounted to as to block an opening window 207 formed on a side surface of the housing 202, and the like. In addition, a water-cooled plate 209 is arranged on the heat radiating plate 203 and enables forced cooling of the heat radiating plate 203.

A control circuit and the like which control a vacuum pump main body (not shown) are mounted to the circuit board 206. In addition, the circuit board 206 is divided by function and is constituted by circuit boards partitioned in plurality such as a circuit board 206a, a circuit board 206b, a circuit board 206c, a circuit board 206d, a circuit board 206e, and a circuit board (panel substrate) 206f. Furthermore, since there is a limit to the space 201 inside the housing 202, the circuit boards 206a to 206f are arranged inside the space 201 in a stepped manner via a plurality of hexagonal spacers 210.

SUMMARY

However, when there is a large number of circuit boards 206 (the circuit board 206a, the circuit board 206b, the circuit board 206c, the circuit board 206d, the circuit board 206e, and the circuit board 206f) as in the case of the conventional vacuum pump control apparatus 200 shown in FIG. 9, the number of parts such as the numbers of harnesses 211 and connectors 212 for connecting the respective circuit boards 206a to 206f to each other increases. It should be noted that, in FIG. 9, only the harness 211 and the connectors 212 electrically connecting the circuit board 206b and the circuit board 206f to each other are shown and the harnesses 211 and the connectors 212 at other connection locations have been omitted and are not shown.

An increase in the number of parts causes an increase in cost and, at the same time, results in a decline in assembly workability. In addition, there is a problem in that routing of the harness 211 and the like may cause degradation of noise resistance due to malfunctions as a result of intrusion of noise into the harness 211.

In consideration thereof, there is a technical problem to be solved in order to provide a vacuum pump control apparatus which is noise resistant and which is capable of improving heat radiation characteristics of a circuit board with a simple configuration and a vacuum pump including the vacuum pump control apparatus, and an object of the present disclosure is to solve the problem.

The present disclosure has been proposed in order to achieve the object described above, and, in some examples, the disclosure describes a vacuum pump control apparatus which controls a vacuum pump main body, the vacuum pump control apparatus including: a plurality of circuit boards including a first circuit board and a second circuit board which constitute a control circuit that controls the vacuum pump main body; a housing having an internal space in which the plurality of the circuit boards are arranged, in which one side of the housing is open; a heat radiating plate to which the first circuit board is mounted so as to enable heat radiation and which is arranged on the housing so as to close the opening of the housing; and a board fixing means which fixes the second circuit board to an inner surface of the housing so as to enable heat radiation.

According to this configuration, heat of the first circuit board is radiated via the heat radiating plate and heat of the second circuit board is radiated via the board fixing means. In addition, since the first circuit board and the second circuit board can be respectively configured in large sizes by fully utilizing the internal space of the housing, the number of circuit boards can be reduced. As a result, the numbers of harnesses and connectors for electrically connecting the respective circuit boards to each other are reduced and, consequently, the number of parts and the number of assembly steps can be reduced. In addition, the second circuit board can be readily fixed to the housing using the board fixing means. Furthermore, since the numbers of harnesses and connectors for electrically connecting the respective circuit boards to each other can be reduced, noise resistance can be improved by reducing a length of the harnesses.

In some examples, the disclosure describes a vacuum pump control apparatus in which the housing is made of aluminum and includes a board mounting seat portion that is formed so as to be capable of coming into contact with the second circuit board.

According to this configuration, heat-transfer efficiency is improved by the use of an aluminum material for the housing. Accordingly, a heat radiating effect can be increased and heat radiation characteristics can be improved.

In some examples, the disclosure describes a vacuum pump control apparatus in which the board mounting seat portion is provided by forming a part of the housing in a protruded shape in a sectional view so as to be capable of coming into contact with the second circuit board.

According to this configuration, since the board mounting seat portion is provided by forming a part of the housing in a protruded shape, the second circuit board can be arranged so as to more reliably come into surface contact with the board mounting seat portion. Accordingly, a heat radiating effect can be increased and heat radiation characteristics can be further improved.

In some examples, the disclosure describes a vacuum pump control apparatus in which the board fixing means includes: a mounting hole which is provided so as to penetrate the housing; and a screwing means which screws and fixes the second circuit board and the housing to each other by a mounting screw that is mounted through the mounting hole.

According to this configuration, the second circuit board and the housing can be screwed with each other by the screwing means having a mounting screw which is mounted through the mounting hole provided in the housing, and the second circuit board can be fixed to the housing from the outside of the housing.

In some examples, the disclosure describes a vacuum pump control apparatus in which the screwing means is a female screw member provided on the second circuit board.

According to this configuration, the second circuit board and the housing can be screwed with each other by the screwing means having a mounting screw which is mounted through the mounting hole provided on the second circuit board, and the second circuit board can be fixed to the housing from the outside of the housing.

In some examples, the disclosure describes a vacuum pump including the vacuum pump control apparatus as described herein.

According to this configuration, a vacuum pump including a vacuum pump control apparatus which is resistant to noise and which has improved heat radiation characteristics with respect to a circuit board can be readily realized.

In some examples, the disclosure describes an assembly method of a vacuum pump control apparatus, in which the housing of the vacuum pump control apparatus is assembled in a state where, after the first circuit board is arranged on the heat radiating plate, the second circuit board is positioned with respect to the first circuit board or the heat radiating plate.

According to this method, a vacuum pump including a vacuum pump control apparatus which is resistant to noise and which has improved heat radiation characteristics with respect to a circuit board can be readily realized.

According to the present disclosure, a vacuum pump control apparatus with a simple configuration which is resistant to noise and which has improved heat radiation characteristics with respect to a circuit board, a vacuum pump including the vacuum pump control apparatus, and an assembly method of the vacuum pump control apparatus can be provided.

DETAILED DESCRIPTION

Figure 1:
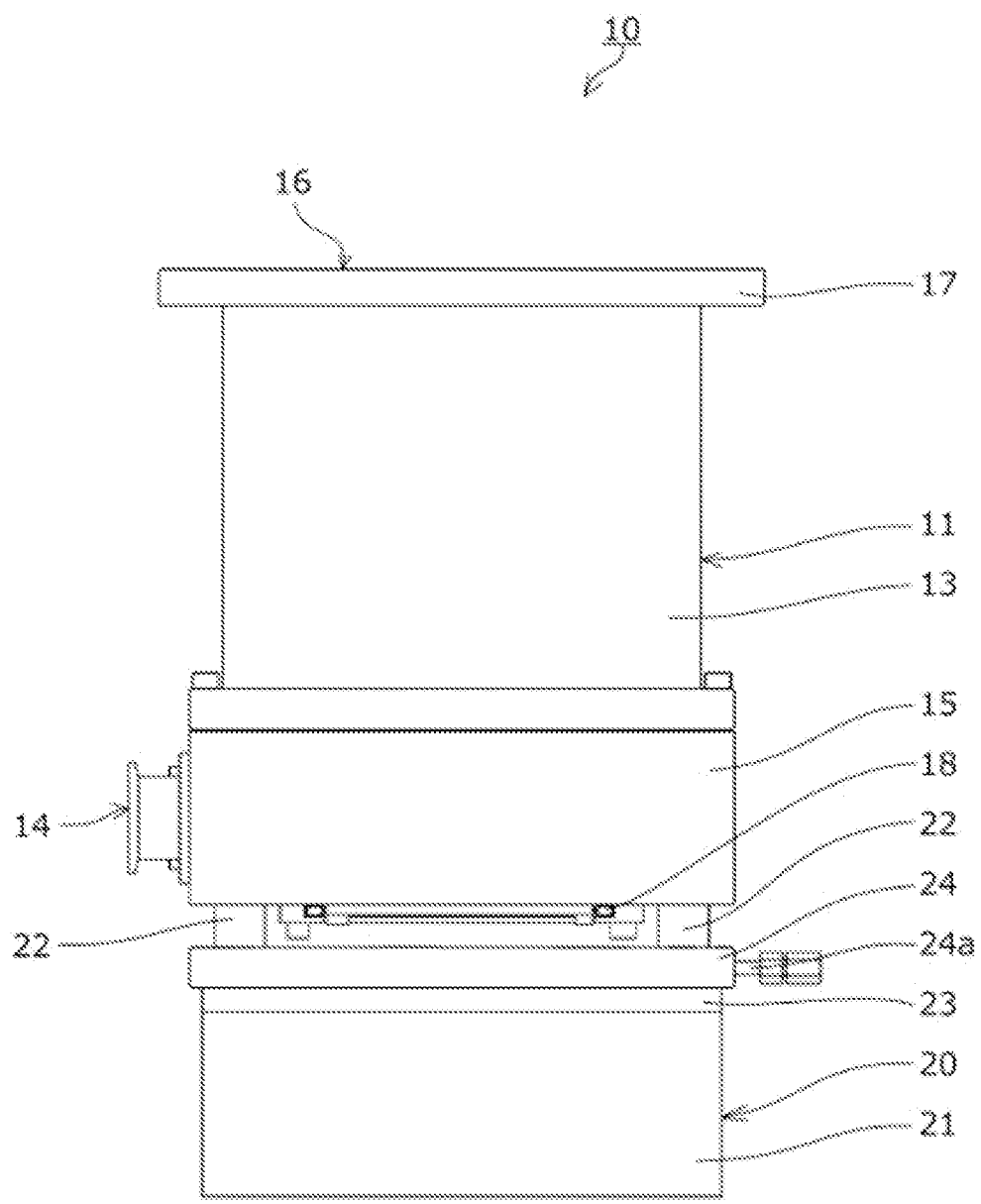
FIG. 1 is a diagram showing a configuration example of a vacuum pump including a vacuum pump control apparatus according to an embodiment of the present disclosure.

The present disclosure achieves the object of providing a vacuum pump control apparatus which is noise resistant and which is capable of improving heat radiation characteristics of a circuit board with a simple configuration and a vacuum pump including the vacuum pump control apparatus by configuring a vacuum pump control apparatus which controls a vacuum pump main body so as to include: a plurality of circuit boards including a first circuit board and a second circuit board which constitute a control circuit that controls the vacuum pump main body; a housing having an internal space in which the circuit boards are arranged, in which an upper side of the housing is open; a heat radiating plate having an internal surface to which the first circuit board is mounted so as to enable heat radiation and being arranged on the housing so as to close the opening of the housing; and a board fixing means which fixes the second circuit board to an inner surface of the housing so as to enable heat radiation.

Hereinafter, a preferred embodiment of the present disclosure will be described in detail with reference to the accompanying drawings. It should be noted that, in the following description of the embodiment, elements that are the same throughout the entire description will be denoted by same reference characters. It should also be noted that, in the following description, expressions indicating directions such as up, down, left, and right should not be construed as being absolute and, while such expressions may be appropriate when each part of a vacuum pump and a vacuum pump control apparatus according to the present disclosure assumes an illustrated posture, in cases where the posture changes, the expressions should be construed to change in accordance with the change in the posture.

Embodiment

FIG. 1 shows an embodiment of the present disclosure and represents an external side view of a vacuum pump 10 including a vacuum pump control apparatus 20 and a vacuum pump main body 11. In the present embodiment, the vacuum pump control apparatus 20 is mounted to the vacuum pump main body 11 via a pump fixing leg 12. In other words, the vacuum pump main body 11 and the vacuum pump control apparatus 20 are integrated with each other.

Figure 2:
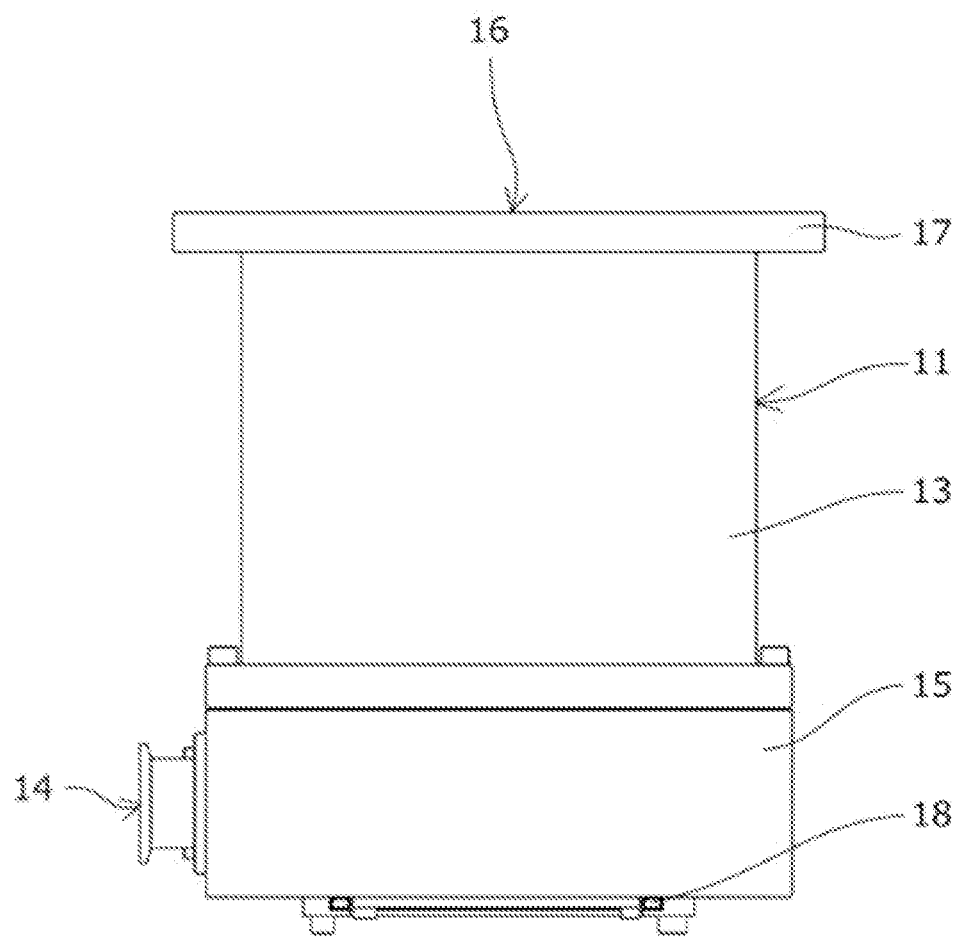
FIG. 2 is a diagram showing a configuration example of a vacuum pump main body according to an embodiment of the present disclosure.

First, a structure of the vacuum pump main body 11 will be described. FIG. 2 is a diagram showing a schematic configuration example of the vacuum pump main body 11 in the vacuum pump 10 according to an embodiment of the present disclosure. The vacuum pump main body 11 has a casing 13 which forms a housing of the vacuum pump main body 11. The casing 13 has an approximately cylindrical shape and, together with a base 15 provided in a lower part (an outlet port 14) of the casing 13, constitutes a housing of the vacuum pump main body 11. Although not shown, a gas transferring mechanism that is a structure enabling the vacuum pump main body 11 to exhibit an exhaust function is housed inside the housing of the vacuum pump main body 11. Generally, the gas transferring mechanism is constituted by a rotatably-supported rotor portion and a stator portion which is fixed to the housing of the vacuum pump main body 11.

An inlet port 16 for introducing a gas into the vacuum pump main body 11 is formed in an upper end portion of the casing 13. In addition, a flange portion 17 which overhangs toward an outer peripheral side is formed on an end surface of the casing 13 on a side of the inlet port 16.

The outlet port 14 for exhausting a gas from the vacuum pump main body 11 is formed in the base 15. In addition, in order to reduce an effect of heat received by the vacuum pump control apparatus 20 from the vacuum pump main body 11, a cooling (water-cooled) tube 18 made of a tube (pipe)-shaped member is embedded in the base 15.

The cooling tube 18 is a member for cooling a periphery of the cooling tube 18 by causing a coolant that is a heating medium to flow inside the cooling tube 18 and having the coolant absorb heat.

Therefore, the vacuum pump 10 is configured such that the base 15 can be forcibly cooled by causing a coolant to flow through the cooling tube 18. The cooling tube 18 is constituted by a member with low thermal resistance or, in other words, a member with high thermal conductivity such as copper, stainless steel, or the like. In addition, the coolant to flow through the cooling tube 18 or, in other words, a material for cooling objects may be either a liquid or a gas. As a liquid coolant, for example, water, an aqueous calcium chloride solution, or an aqueous ethylene glycol solution can be used, and as a gas coolant, for example, ammonia, methane, ethane, a halogen, helium, carbon dioxide, or air can be used. While the cooling tube 18 is arranged in the base 15 in the present embodiment, an arrangement position of the cooling tube 18 is not limited thereto. For example, the cooling tube 18 may be provided so as to be directly fitted to an inside of a stator column (not shown) of the vacuum pump main body 11.

Figure 3:
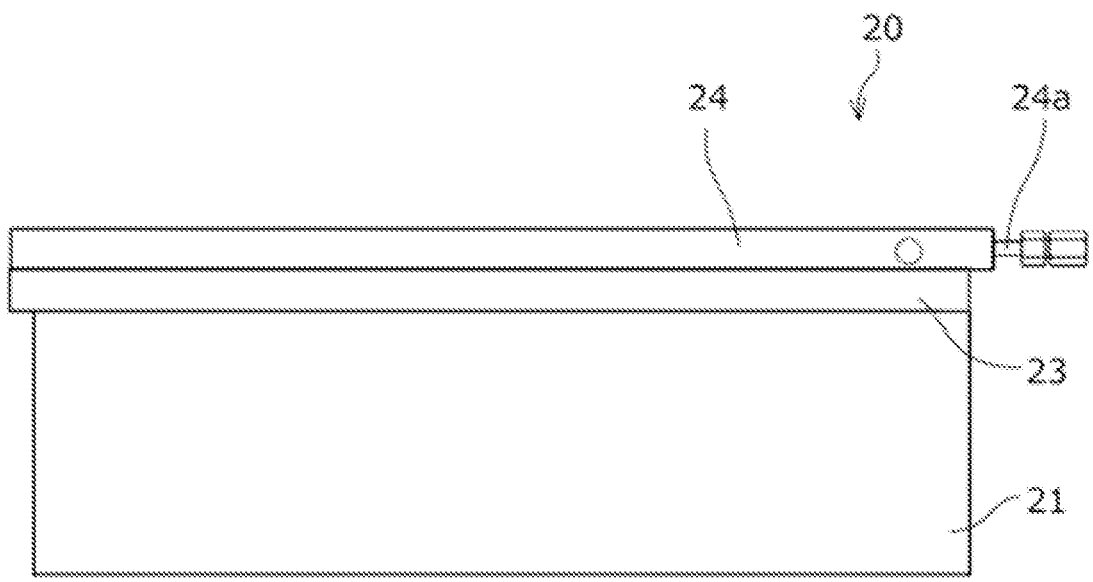
FIG. 3 is a side view showing a configuration example of a vacuum pump control apparatus according to an embodiment of the present disclosure from a direction opposite to a front panel.
Figure 4:
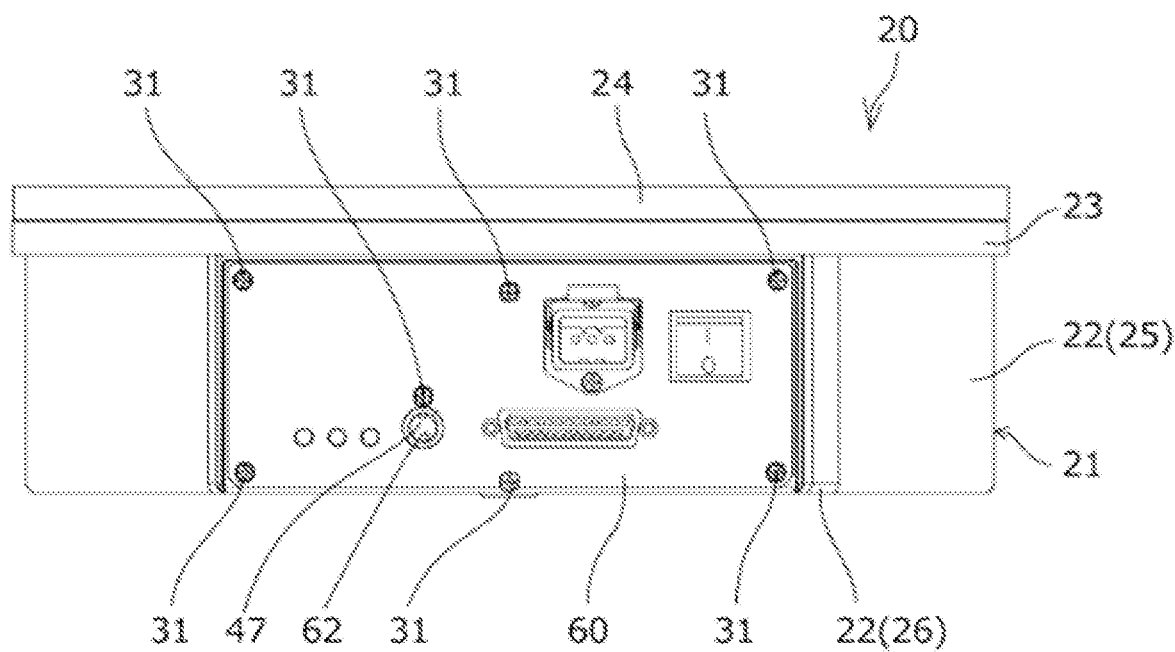
FIG. 4 is a side view showing a configuration example of a vacuum pump control apparatus according to an embodiment of the present disclosure from a side of a front panel.
Figure 5:
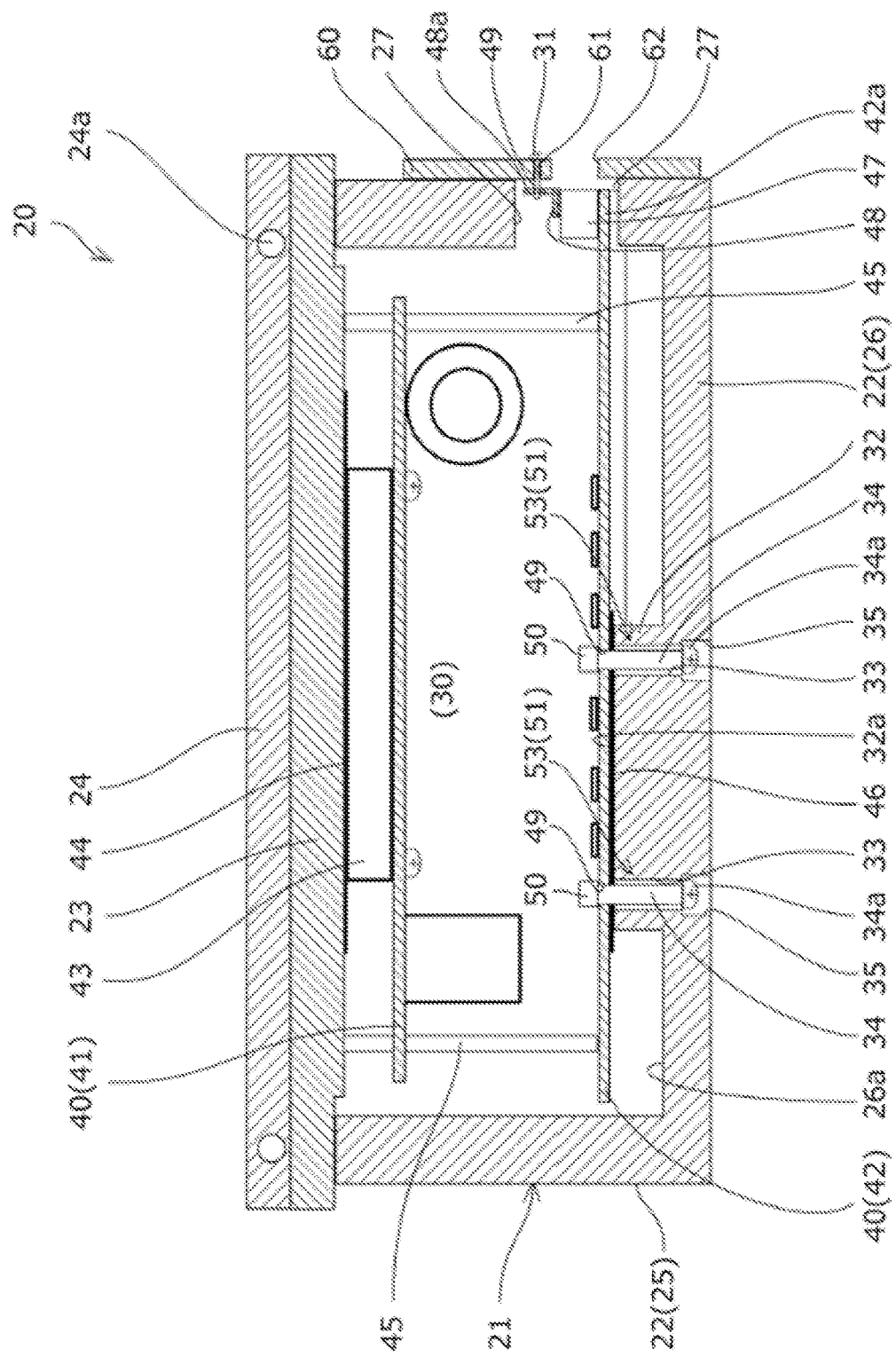
FIG. 5 is an enlarged sectional view schematically showing a configuration example of the vacuum pump control apparatus according to an embodiment of the present disclosure.

Next, a structure of the vacuum pump control apparatus 20 to be mounted to the vacuum pump main body 11 configured as described above will be described. FIGS. 3 to 5 show the vacuum pump control apparatus 20, in which FIG. 3 is a side view showing the vacuum pump control apparatus 20 from a direction opposite to a front panel 60 (a rear surface side), FIG. 4 is a side view showing the vacuum pump control apparatus 20 from a side of the front panel 60, and FIG. 5 is an enlarged sectional view schematically showing an internal configuration example of the vacuum pump control apparatus 20.

The vacuum pump control apparatus 20 according to the present embodiment constitutes a control unit including a control circuit which controls various operations in the vacuum pump main body 11 and, as shown in FIG. 1, the vacuum pump control apparatus 20 is arranged in (mounted to) a lower portion (bottom portion) of the base 15 in the vacuum pump main body 11.

The vacuum pump control apparatus 20 according to the present embodiment is provided with a connector (not shown) which forms a pair with a connector (not shown) provided in the vacuum pump main body 11. In addition, the control circuit provided in the vacuum pump control apparatus 20 is configured so as to be electrically connected to electronic parts of the vacuum pump main body 11 by joining (coupling) the connector of the vacuum pump main body 11 and the connector of the vacuum pump control apparatus 20 to each other. Therefore, the vacuum pump control apparatus 20 is configured so as to be capable of supplying the vacuum pump main body 11 with various signals and power for driving the vacuum pump main body 11 and receiving various signals and the like from the vacuum pump main body 11 without using a dedicated cable for connecting the vacuum pump main body 11 and the vacuum pump control apparatus 20 to each other.

In the vacuum pump control apparatus 20, a housing 22 of the vacuum pump control apparatus 20 and a heat radiating plate 23 arranged in an upper portion of the housing 22 constitute a casing 21 of the vacuum pump control apparatus. The housing 22 and the heat radiating plate 23 are respectively formed of aluminum die-cast in order to enhance thermal conduction efficiency. In addition, a water-cooled plate 24 is arranged on the heat radiating plate 23.

A cooling tube 24a for water cooling which is similar to the cooling tube 18 of the vacuum pump main body 11 described earlier is circumferentially embedded in the water-cooled plate 24. The cooling tube 24a is cooled by causing a coolant to flow inside the cooling tube 24a and is provided so as to be in contact with the water-cooled plate 24 in order to forcibly cool the water-cooled plate 24. In addition, the water-cooled plate 24 is fixed to an upper surface of the heat radiating plate 23 by a fastening member such as a bolt (not shown). In the present embodiment, the water-cooled plate 24 is configured so as to be readily separable from the vacuum pump control apparatus 20 by removing the bolt (not shown) or, in other words, attachably and detachably configured with respect to the vacuum pump control apparatus 20. Alternatively, the heat radiating plate 23 and the water-cooled plate 24 may be integrated with each other.

Figure 6:
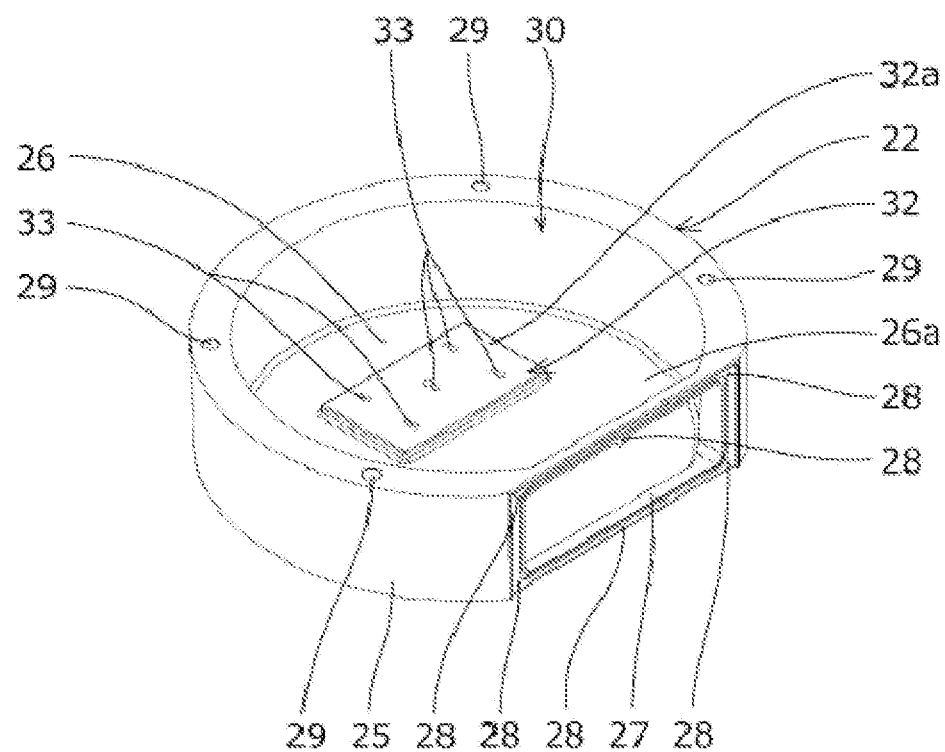
FIG. 6 is a perspective view showing a configuration of a housing in the vacuum pump control apparatus according to an embodiment of the present disclosure from an upper surface side.
Figure 7:
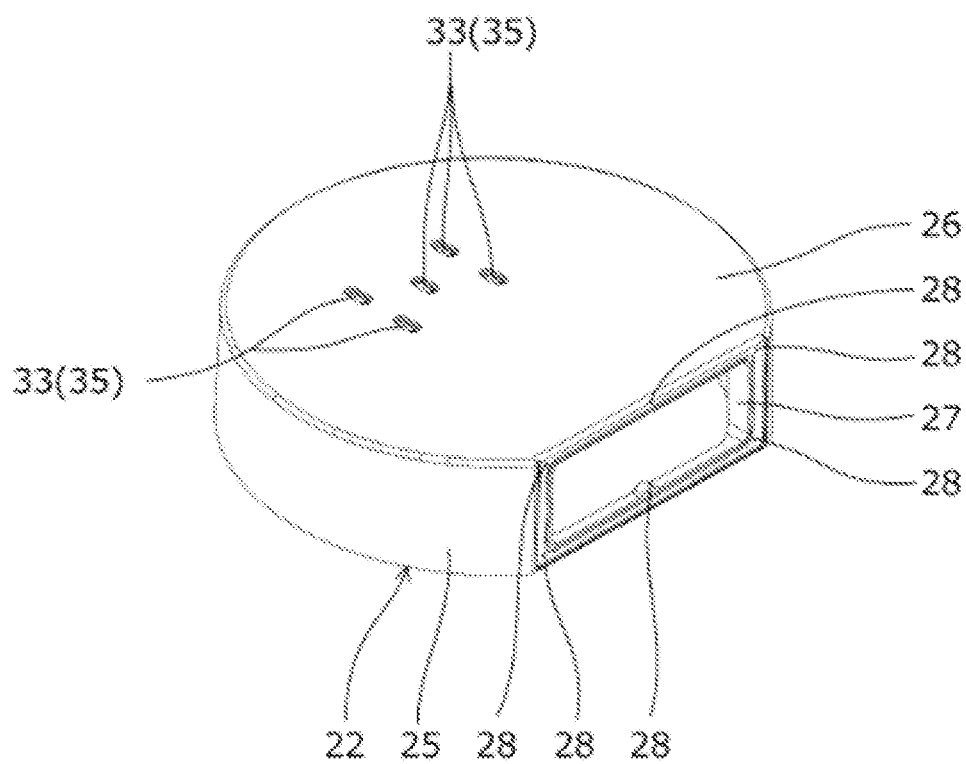
FIG. 7 is a perspective view showing a configuration of a housing in the vacuum pump control apparatus according to an embodiment of the present disclosure from a lower surface side.

As shown in FIGS. 6 and 7, the housing 22 has a side surface portion 25 with an approximately cylindrical shape and a bottom surface portion 26 which blocks a lower end side of the side surface portion 25, and the housing 22 is provided with a space 30 of which an upper side is open (hereinafter, referred to as an "upper side opening") and a lower surface is closed by the bottom surface portion 26 and in which a circuit board 40 constituting the control circuit that controls the vacuum pump main body 11 is arranged.

In addition, a rectangular opening window 27 to which the front panel 60 is to be mounted in a state where the opening window 27 is approximately blocked by the front panel 60 is formed on a front surface side of the side surface portion 25 of the housing 22. Moreover, a mounting screw hole 28 is formed on a peripheral edge of the opening window 27 so as to correspond to a mounting hole (not shown) provided on the front panel 60, and a mounting screw hole 29 is formed on the upper surface of the housing 22 so as to correspond to a mounting hole (not shown) provided on the heat radiating plate 23. Furthermore, as shown in FIG. 4, the front panel 60 is attachably and detachably mounted to the front surface of the housing 22 by a mounting screw 31 that is screwed into the mounting screw hole 29 in a state where the opening window 27 is closed by the front panel 60. On the other hand, as shown in FIGS. 3, 4, and 5, the heat radiating plate 23 is attachably and detachably mounted to the upper side of the housing 22 by a mounting screw (not shown) in a state where the upper side opening of the housing 22 is closed. When mounting the heat radiating plate 23 to the housing 22, an O-ring (not shown) is interposed so as to provide a seal between the housing 22 and the heat radiating plate 23.

A board mounting seat portion 32 provided in a convex shape in a sectional view so as to protrude toward the inside of the space 30 is integrally formed with the bottom surface portion 26 of the housing 22 in a state where a part of the board mounting seat portion 32 is overlaid on an upper surface 26a of the bottom surface portion 26. An upper surface 32a of the board mounting seat portion 32 is formed in an approximately planar shape and a rectangular shape in a plan view. Alternatively, the board mounting seat portion 32 may be formed by a part separate from the housing 22.

The board mounting seat portion 32 is provided with a plurality of (in the present example, five) mutually-parallel long holes 33 as mounting holes which penetrate the board mounting seat portion 32 upward and downward and which extend in an elongated manner in a front-rear direction (a direction of a front surface provided with the opening window 27 and a direction of a rear surface which is opposite to the direction of the front surface). On a side of a lower surface 26b of the bottom surface portion 26, a counterbore 35 for receiving a head 34a of a mounting screw 34 is formed on an outer peripheral edge of the long hole 33. Therefore, the mounting screw 34 mounted to the long hole 33 is configured so as to enable position adjustment by moving in the front-rear direction inside the long hole 33. While the mounting hole (the long hole 33) in FIG. 7 is a long hole, the mounting hole may have any hole shape as long as position adjustment can be performed.

The circuit board 40 is a printed wiring board. The circuit board 40 is divided by function and includes a first circuit board 41 mounted with a control circuit (not shown) which controls the vacuum pump main body 11, a power supply 43, and the like, and a second circuit board 42 similarly mounted with a control circuit (not shown) which controls the vacuum pump main body 11, and the like. The first circuit board 41 and the second circuit board 42 are electrically connected to each other via a harness and a connector (both not shown). In addition, by fully utilizing the space 30 inside the housing 22, the first circuit board 41 and the second circuit board 42 are respectively formed as circuit boards having large component mounting areas and being approximately similar in shape to a planar shape of the space 30.

The first circuit board 41 has an insulating sheet material 44 interposed between the heat radiating plate 23 and the power supply 43 and is arranged in a state where the first circuit board 41 is in surface contact with a lower surface of the heat radiating plate 23. In addition, the first circuit board 41 is configured so as to be capable of radiating heat generated on the first circuit board 41 via the heat radiating plate 23. Furthermore, a plurality of hexagonal spacers 45 respectively having a hexagonal sectional shape are provided on the lower surface of the heat radiating plate 23 so as to be suspended therefrom.

As shown in FIG. 5, the second circuit board 42 has an insulating sheet material 46 interposed between the board mounting seat portion 32 and the second circuit board 42 and is arranged in a state where the second circuit board 42 is in surface contact with the upper surface 32a of the board mounting seat portion 32. In addition, the second circuit board 42 is configured so as to be capable of radiating heat generated on the second circuit board 42 via the board mounting seat portion 32 or, in other words, via the housing 22. Furthermore, as shown in FIG. 5, a part 42a of the second circuit board 42 is configured so as to be arranged in a state where the part 42a overhangs into the opening window 27 of the housing 22, and a connector 47 is fixed and mounted to an upper surface of the part 42a. Moreover, a mounting bracket 48 is mounted to an upper surface of the connector 47. The mounting bracket 48 is provided with a fixing piece 48a arranged so as to planarly oppose the front panel 60. In addition, the fixing piece 48a is provided with a screw hole 49 for fixing the mounting screw 31 to be inserted from a mounting hole 61 of the front panel 60. A long hole (not shown) is also formed on the insulating sheet material 46 so as to correspond to the long hole 33 provided in the board mounting seat portion 32.

Figure 9:
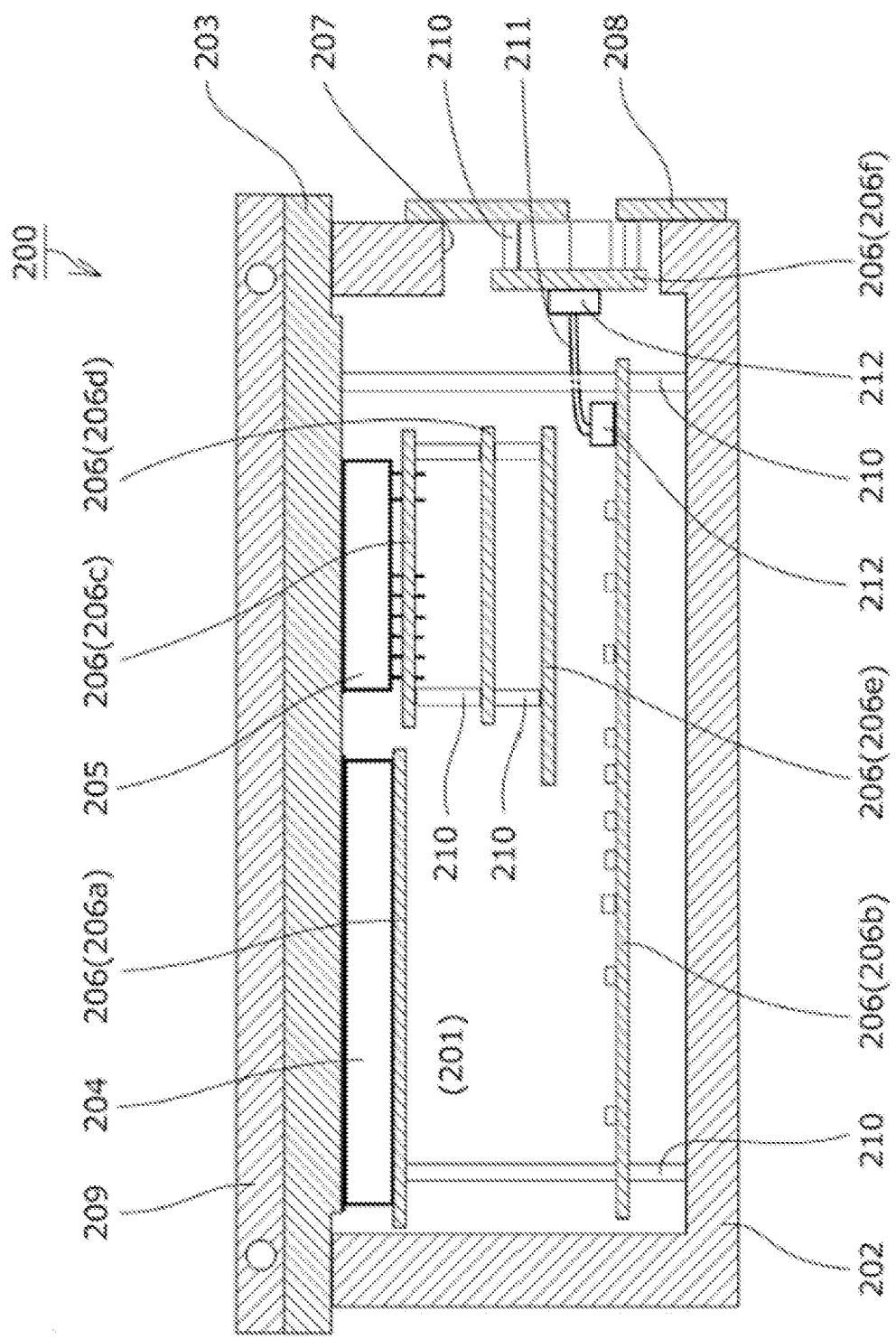
FIG. 9 is a sectional view showing a configuration example of a conventional vacuum pump control apparatus.

As shown in FIG. 5, through-holes 49 provided so as to respectively correspond to the long holes 33 of the board mounting seat portion 32 are formed in the second circuit board 42. In addition, on the second circuit board 42, a fixing nut 50 is provided on and fixed to the second circuit board 42 so as to correspond to each through-hole 49 and to be concentric with the through-hole 49 by soldering or the like. The mounting screw 34 inserted from the lower surface side of the housing 22 through the long hole 33 and the through-hole 49 is screwed to the fixing nut 50, and the second circuit board 42 can be attachably and detachably fixed to the board mounting seat portion 32 by screwing the mounting screw 34. In addition to an opening 62 which corresponds to the connector 47 arranged in the part 42a of the second circuit board 42, the front panel 60 is provided with a plurality of openings (not shown) so as to correspond to various components (not shown) or the like. Therefore, various external devices can be connected to each connector arranged in the opening 62 of the front panel 60. In other words, the numbers of the harness 211, the connector 212, and the like for connecting the circuit board 206f for the front panel 208 to the circuit board 206b shown in FIG. 9 as a conventional structure can be reduced.

In the present embodiment, a board fixing means 51 is constituted by the bottom surface portion 26 of the housing 22, the board mounting seat portion 32, the long hole 33, the through-hole 49, the fixing nut 50 which is a female screw member, and the mounting screw 34, and a screwing means 53 which fixes the second circuit board 42 and the housing 22 to each other is constituted by the long hole 33 and the fixing nut 50. In other words, the screwing means 53 in the present embodiment is a part of the board fixing means 51. In addition, the first circuit board 41 and the second circuit board 42 are provided with connectors (not shown) for electrically connecting the first circuit board 41 and the second circuit board 42 to each other from outside using a harness and a connector (both not shown) after assembly of the vacuum pump control apparatus 20.

Next, an example of an assembly procedure of the vacuum pump control apparatus 20 configured as described above will be described with reference to FIG. 5. It should be noted that the assembly procedure described below merely represents an example and the present disclosure is not limited to articles created according to the assembly procedure.

(1) First, the heat radiating plate 23 is prepared in which the power supply 43, the first circuit board 41, and the hexagonal spacers 45 have been mounted to the lower surface (inner surface) side thereof. In addition, the heat radiating plate 23 is placed on an assembly table (not shown) with the lower surface of the heat radiating plate 23 facing upward. In other words, in this case, assembly is performed by reversing an upward-downward posture. In other words, in this case, the first circuit board 41 is arranged on the heat radiating plate 23.

(2) Next, the second circuit board 42 is prepared in which circuit components have been mounted at prescribed positions and, at the same time, the connector 47 and the like have been mounted to the part 42a. In addition, the second circuit board 42 is arranged on the hexagonal spacers 45 erected on the heat radiating plate 23 so that an orientation of the part 42a of the second circuit board 42 corresponds to the opening window 27. Subsequently, the insulating sheet material 46 is arranged on the board mounting seat portion 32. In other words, in this case, the second circuit board 42 is positioned with respect to the heat radiating plate 23 and the first circuit board 41 via the hexagonal spacers 45. When the hexagonal spacers 45 are only positioned on the heat radiating plate 23, the second circuit board 42 is positioned with respect to the heat radiating plate 23, but in other cases, the second circuit board 42 may be only positioned with respect to the first circuit board 41.

(3) Next, the housing 22 is overlaid on the second circuit board 42 from above so that the upper side opening of the housing 22 is on a lower side and the part 42a of the second circuit board 42 is arranged inside the opening window 27 to create a state where the upper side opening of the housing 22 is blocked by the heat radiating plate 23. In this case, an O-ring (not shown) is interposed so as to provide a seal between the housing 22 and the heat radiating plate 23.

(4) Subsequently, the mounting screw 34 is inserted from the lower surface side of the housing 22 through the long hole 33, the insulating sheet material 46, and the through-hole 49 in this order and the mounting screw 34 is screwed to the fixing nut 50. Accordingly, the second circuit board 42 is fixed in a state of close surface contact on the board mounting seat portion 32 of the housing 22 via the insulating sheet material 46. When fixing the second circuit board 42 at this point, fastening by the screwing means 53 or, in other words, fastening by the mounting screw 34 is kept loose so that the second circuit board 42 can still move.

(5) Next, the front panel 60 is arranged so as to block the opening window 27 from the outside of the housing 22 and, furthermore, the front panel 60 is fixed to the housing 22 with the mounting screw 31 that is screwed to the mounting screw hole 28. In addition, in this operation, as shown in FIG. 5, the mounting screw 31 is also screwed to the screw hole 49 provided in the fixing piece 48a of the mounting bracket 48 so as to fix the connector 47 and the front panel 60 to each other with the mounting screw 31. When performing this mounting operation, a distance between the connector 47 and the front panel 60 can be adjusted by moving the second circuit board 42 as described above. Furthermore, once position adjustment and fixing of the second circuit board 42 are completed, the mounting screw 34 is further tightened to properly fix the second circuit board 42 to the board mounting seat portion 32. In other words, using the screwing means 53 of the board fixing means 51, the second circuit board 42 is properly fixed to the bottom surface portion 26 of the housing 22 (the inner surface of the housing 22) so as to enable cooling and heat radiation.

(6) Next, the orientation of the housing 22 is restored to an upward-downward reverse posture together with the heat radiating plate 23 while keeping the upper side opening of the housing 22 blocked by the heat radiating plate 23. In other words, a state where the heat radiating plate 23 is arranged on an upper side is restored. Subsequently, the heat radiating plate 23 and the housing 22 are fixed to each other by a mounting screw (not shown). As shown in FIG. 5, in the state where the heat radiating plate 23 is mounted to the housing 22, lower ends of the hexagonal spacers 45 fixed and mounted to the heat radiating plate 23 are either slightly separated from or in loose contact with the second circuit board 42.

(7) Next, the first circuit board 41 and the second circuit board 42 are electrically fixed to each other by a connector and a harness (not shown) from the outside of the housing 22. Subsequently, the water-cooled plate 24 is mounted onto the heat radiating plate 23 to complete assembly of the vacuum pump control apparatus 20.

In addition, the vacuum pump main body 11 is installed on top of the vacuum pump control apparatus 20 completed in this manner, and the vacuum pump main body 11 and the vacuum pump control apparatus 20 are further electrically connected to each other to complete the vacuum pump 10.

In the vacuum pump 10 configured in this manner, when a coolant is caused to flow through the cooling tube 18 arranged in the base 15, heat generated in the vacuum pump main body 11 can be forcibly radiated by the base 15.

On the other hand, in the vacuum pump control apparatus 20, heat generated on the first circuit board 41 is radiated via the hexagonal spacers 45 and the heat radiating plate 23 and heat generated on the second circuit board 42 is radiated via the board fixing means 51. In addition, since the water-cooled plate 24 is provided on the heat radiating plate 23, the heat radiating plate 23 and the board fixing means 51 are forcibly cooled by the water-cooled plate 24 and heat radiation characteristics with respect to the first circuit board 41 and the second circuit board 42 are enhanced.

Furthermore, since the circuit board 40 is generally divided into two circuit boards, namely, the first circuit board 41 and the second circuit board 42, and functions are consolidated for each of the circuit boards 41 and 42, the number of circuit boards and the number of components such as harnesses can be reduced as compared to conventional vacuum pump control apparatuses. Therefore, since the numbers of harnesses and connectors can be reduced, a length of the harnesses can be reduced and noise resistance can be improved.

In addition, since the first circuit board 41 and the second circuit board 42 are respective provided with a connector for electrically connecting the first circuit board 41 and the second circuit board 42 to each other from outside using a harness and a connector (not shown) after assembly of the vacuum pump control apparatus 20, the first circuit board 41 and the second circuit board 42 can be electrically connected to each other from outside of the housing 22 after assembling the housing 22 and the heat radiating plate 23. Accordingly, a length of the harness for connecting the first circuit board 41 and the second circuit board 42 to each other can be reduced. More specifically, since the first circuit board 41 and the second circuit board 42 are in a state of being positioned by the hexagonal spacers 45 prior to the assembly of the housing 22, the length of the harness for connecting the first circuit board 41 and the second circuit board 42 to each other can be minimized.

Furthermore, in the second circuit board 42, the board fixing means 51 is configured so that the mounting screw 34 is inserted from the lower surface side of the housing 22 through the long hole 33, the insulating sheet material 46, and the through-hole 49 in this order and the mounting screw 34 is screwed to the fixing nut 50. Accordingly, since the second circuit board 42 can be arranged in close contact onto the board mounting seat portion 32 of the housing 22 via the insulating sheet material 46 from outside of the housing 22, the second circuit board 42 can be readily fixed to the housing 22 after assembling the housing 22 and the heat radiating plate 23.

In addition, since the housing 22 is assembled in the vacuum pump control apparatus 20 after the first circuit board 41 is arranged on the heat radiating plate 23 and in a state where the second circuit board 42 is positioned with respect to the heat radiating plate 23, the vacuum pump 10 including the vacuum pump control apparatus 20 which is resistant to noise and which has improved heat radiation characteristics with respect to the circuit board 40 can be readily realized.

Figure 8:
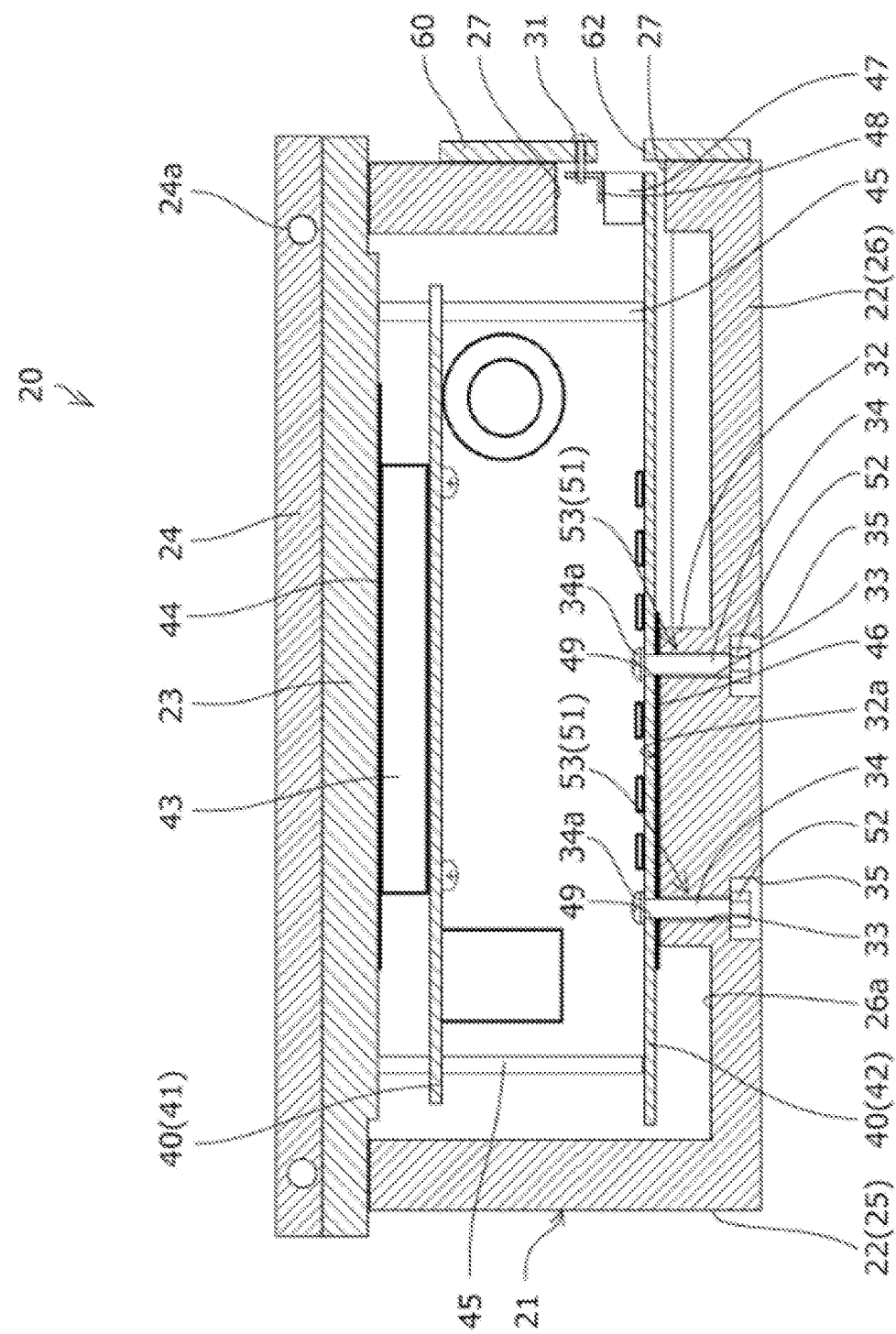
FIG. 8 is an enlarged sectional view showing a modification of a vacuum pump control apparatus according to an embodiment of the present disclosure.

While the embodiment described above discloses a structure of the board fixing means 51 in which the fixing nut 50 constituted by a female screw member is provided on the second circuit board 42 so as to correspond to the through-hole 49 on the second circuit board 42, alternatively, a plate or the like provided with a female screw may be used. Alternatively, a configuration such as that shown in FIG. 8 may be adopted. Specifically, in the configuration of the board fixing means 51 shown in FIG. 8, the mounting screw 34 having a head 34a is inserted into the through-hole 49 provided on the second circuit board 42 and the mounting screw 34 is fixed to the through-hole 49 by soldering or the like and suspended from the circuit board 42. In addition, a tip portion of the suspended mounting screw 34 is passed through the long hole 33 so as to protrude to a rear surface side of the housing 22 and into the counterbore 35, and a hexagonal nut 52 may be screwed onto the tip portion of the suspended mounting screw 34 in the counterbore 35 to fix the mounting screw 34 by tightening the hexagonal nut 52.

In addition, it will be obvious to those skilled in the art that various changes and modifications may be made without departing from the spirit of the present disclosure and that the present disclosure also encompasses such changes and modifications.

REFERENCE SIGNS LIST

10 Vacuum pump
11 Vacuum pump main body
12 Pump fixing leg
13 Casing
14 Outlet port
15 Base
16 Inlet port
17 Flange portion
18 Cooling tube
20 Vacuum pump control apparatus
21 Casing
22 Housing
23 Heat radiating plate
24 Water-cooled plate
24a Cooling tube
25 Side surface portion
26 Bottom surface portion
26a Upper surface
26b Lower surface
27 Opening window
28 Mounting screw hole
29 Mounting screw hole
30 Space
31 Mounting screw
32 Board mounting seat portion
32a Upper surface
33 Long hole (mounting hole)
34 Mounting screw
34a Head
35 Counterbore
40 Circuit board
41 First circuit board
42 Second circuit board
42a Part
43 Power supply
44 Insulating sheet material
45 Hexagonal spacer
46 Insulating sheet material
47 Connector
48 Mounting bracket
48a Fixing piece
49 Through-hole
50 Fixing nut (female screw member)
51 Board fixing means
52 Hexagonal nut
53 Screwing means
60 Front panel
61 Mounting hole
62 Opening

What is claimed is:

1. A vacuum pump control apparatus which controls a vacuum pump main body, the vacuum pump control apparatus comprising:
    a plurality of circuit boards including a first circuit board and a second circuit board which constitute a control circuit that controls the vacuum pump main body;
    a housing having an internal space in which the plurality of the circuit boards are arranged, wherein one side of the housing is open;
    a heat radiating plate to which the first circuit board is mounted so as to enable heat radiation and which is arranged on the housing so as to close the opening of the housing;
    a board fixing means which fixes the second circuit board to an inner surface of the housing so as to enable heat radiation; and
    spacers which are either slightly separated from or in loose contact with the second circuit board,
    wherein the second circuit board is arranged on the spacers without being fixed.

2. The vacuum pump control apparatus according to claim 1, wherein the housing is made of aluminum and includes a board mounting seat portion that is formed so as to be capable of coming into contact with the second circuit board.

3. The vacuum pump control apparatus according to claim 2, wherein
the board mounting seat portion is provided by forming a part of the housing in a protruded shape in a sectional view so as to be capable of coming into contact with the second circuit board.

4. A vacuum pump comprising the vacuum pump control apparatus according to claim 3.

5. The vacuum pump control apparatus according to claim 2, wherein
the board fixing means includes:
a mounting hole which is provided so as to penetrate the housing; and
a screwing means which screws and fixes the second circuit board and the housing with each other by a mounting screw that is mounted through the mounting hole.

6. A vacuum pump comprising the vacuum pump control apparatus according to claim 2.

7. The vacuum pump control apparatus according to claim 1, wherein
the board fixing means includes:
a mounting hole which is provided so as to penetrate the housing; and
a screwing means which screws and fixes the second circuit board and the housing with each other by a mounting screw that is mounted through the mounting hole.

8. The vacuum pump control apparatus according to claim 7, wherein
the screwing means is a female screw member provided on the second circuit board.

9. A vacuum pump comprising the vacuum pump control apparatus according to claim 1.

10. An assembly method for a vacuum pump control apparatus, the method comprising:
mounting a first circuit board on a heat radiating plate of the vacuum pump control apparatus of a vacuum pump main body; and
subsequent to mounting the first circuit board on the heat radiating plate, positioning a second circuit board with respect to the first circuit board or the heat radiating plate in a housing having an internal space in which a plurality of circuit boards including the first circuit board and the second circuit board are arranged,
wherein the plurality of circuit boards including the first circuit board and the second circuit board constitute a control circuit that controls the vacuum pump main body,
wherein the housing has an internal space in which the plurality of the circuit boards are arranged and has one side of the housing that is open,
wherein the heat radiating plate is mounted to the housing so as to enable heat radiation and is arranged on the housing so as to close the opening of the housing,
wherein the second circuit board is mounted to an inner surface of the housing by a board fixing means which enables heat radiation,
wherein the second circuit board is slightly separated from or in loose contact with one or more spacers, and
wherein the second circuit board is arranged on the spacers without being fixed.

11. The assembly method of a vacuum pump control apparatus of claim 10, wherein the method further comprises:
positioning the second circuit board in close contact with a board mounting seat portion of the housing, wherein the housing is formed from aluminum.

12. The assembly method of a vacuum pump control apparatus of claim 11, wherein positioning the second circuit board in close contact with the board mounting seat portion of the housing includes positioning the second circuit board on a board mounting seat portion which forms a protruded shape in a sectional view so as to be capable of coming into contact with the second circuit board.

* * * * *